US007732308B2

(12) United States Patent
Schumacher et al.

(10) Patent No.: US 7,732,308 B2
(45) Date of Patent: *__Jun. 8, 2010__

(54) PROCESS FOR DEPOSITING LAYERS CONTAINING SILICON AND GERMANIUM

(75) Inventors: Marcus Schumacher, Deutschland (DE); Peter Baumann, Deutschland (DE); Johannes Lindner, Deutschland (DE); Timothy McEntee, Deutschland (DE)

(73) Assignee: Aixtron, Inc., Sunnyvale, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 11/572,101

(22) PCT Filed: Feb. 22, 2005

(86) PCT No.: PCT/US2005/050756

§ 371 (c)(1),
(2), (4) Date: Nov. 21, 2008

(87) PCT Pub. No.: WO2006/005637

PCT Pub. Date: Jan. 19, 2006

(65) Prior Publication Data

US 2009/0081853 A1    Mar. 26, 2009

(30) Foreign Application Priority Data

Jul. 15, 2004    (DE)    ........................ 10 2004 034 103

(51) Int. Cl.
*H01L 21/00* (2006.01)
(52) U.S. Cl. ........................................ 438/500; 438/933
(58) Field of Classification Search .......... 438/479–502
See application file for complete search history.

(56) References Cited

U.S. PATENT DOCUMENTS 6,194,229 B1    2/2001    Basceri (Continued)

FOREIGN PATENT DOCUMENTS

DE    100 57 491 A1    11/2000

(Continued)

OTHER PUBLICATIONS

PCT/EP2005/050756 PCT International Search Report and Written Opinion, Jun. 9, 2005, 12 pages.

(Continued)

*Primary Examiner*—Richard A. Booth
(74) *Attorney, Agent, or Firm*—Sonnenschein Nath & Rosenthal LLP

(57) ABSTRACT

The invention relates to a method for depositing at least one semiconductor layer on at least one substrate in a processing chamber (2). Said semiconductor layer is composed of several components which are evaporated by non-continuously injecting a liquid starting material (3) or a starting material (3) dissolved in a liquid into a tempered evaporation chamber (4) with the aid of one respective injector unit (5) while said vapor is fed to the processing chamber by means of a carrier gas (7). The inventive method is characterized in that the mass flow rate parameters, such as the preliminary injection pressure, the injection frequency, the pulse/pause ratio, and the phase relation between the pulses/pauses and the pulses/pauses of the other injector unit(s), which determine the progress of the mass flow rate of a first silicon-containing starting material and a germanium-containing second starting material (3) through the associated injector unit (5), are individually adjusted or varied.

29 Claims, 1 Drawing Sheet

U.S. PATENT DOCUMENTS

Figure 1:
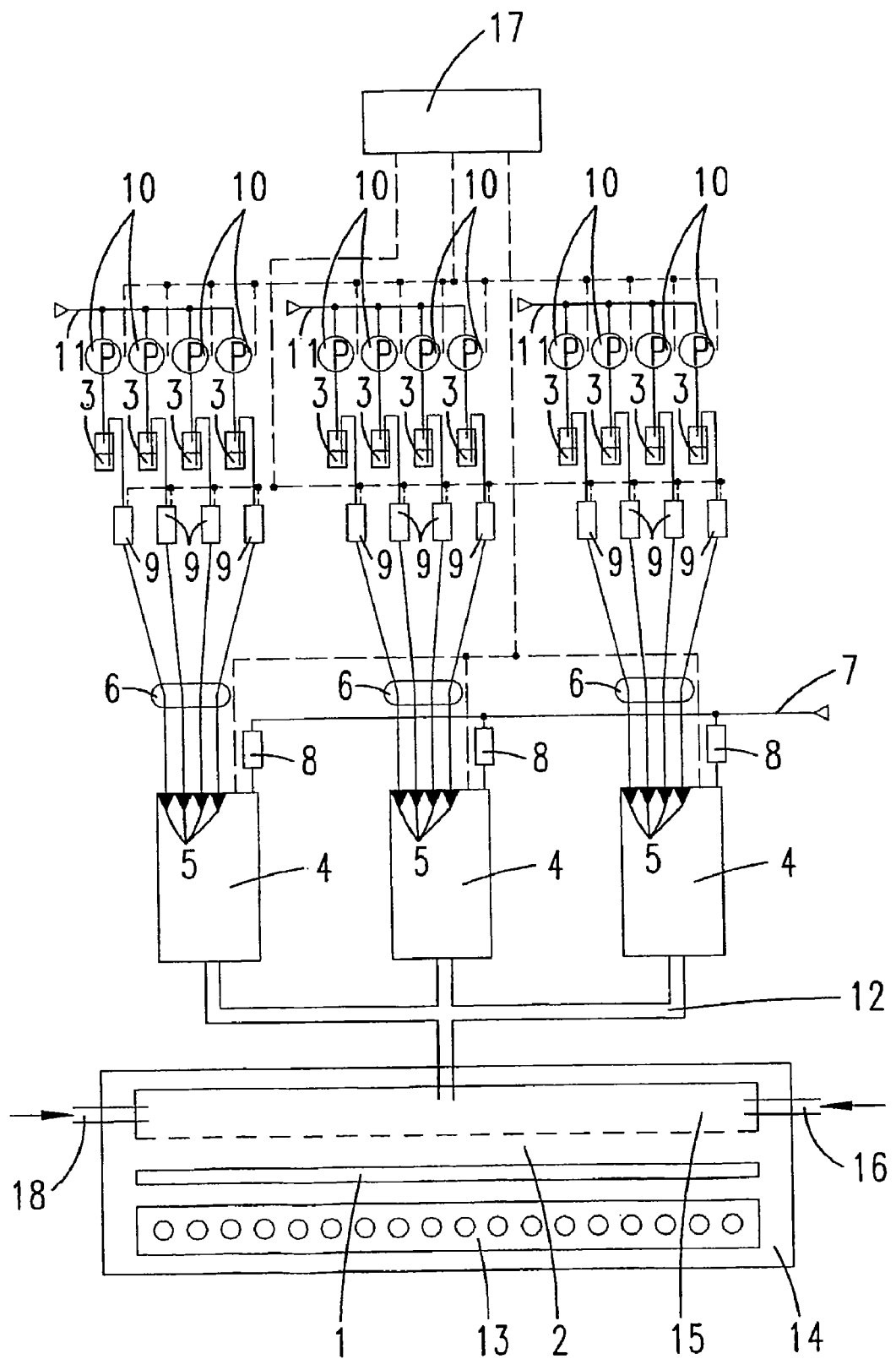

| | | | |
|---|---|---|---|
| 7,410,670 B2 * | 8/2008 | Schumacher et al. | 427/248.1 |
| 2001/0034123 A1 | 10/2001 | Jeon et al. | |
| 2001/0041250 A1 | 11/2001 | Werkhoven et al. | |
| 2002/0030246 A1 | 3/2002 | Eisenbeiser et al. | |
| 2003/0003244 A1 | 1/2003 | Rossman | |
| 2003/0139005 A1 | 7/2003 | Song et al. | |

FOREIGN PATENT DOCUMENTS

| | | |
|---|---|---|
| DE | 101 14 956 A1 | 3/2001 |
| DE | 101 56 932 A1 | 11/2001 |
| DE | 10057491 | 5/2002 |
| DE | 10114956 | 10/2002 |
| DE | 10156932 | 5/2003 |
| EP | 0 307 995 A2 | 9/1988 |
| EP | 1 039 512 A2 | 9/2000 |
| EP | 1038988 | 9/2000 |
| EP | 1069599 | 1/2001 |
| JP | 2002173777 | 6/2002 |
| WO | 00/63957 | 10/2000 |
| WO | 01/66832 A2 | 9/2001 |
| WO | 03/103031 A2 | 12/2003 |

OTHER PUBLICATIONS

K. Nakai, et al., "Low-temperature heteroepitaxial growth of SiGe on Si with low-pressure chemical vapor deposition", Journal of Crystal Growth, Jan. 1993, pp. 285-292, Nos. 2/3, Amsterdam, NL.

Hiroyuki Hirayama, et al., "Selective heteroepitaxial growth of $Si_{1-x}Ge_x$ using gas source molecular beam epitaxy", Applied Physics Letters, Mar. 19, 1990, pp. 1107-1109, No. 12, New York, US.

Aixtron, AG; PCT/EP2004/052063 filed Sep. 7, 204; International Search Report; 3pp.

* cited by examiner

PROCESS FOR DEPOSITING LAYERS CONTAINING SILICON AND GERMANIUM

CROSS REFERENCES TO RELATED APPLICATIONS

The present patent application is a national phase application of International Application No. PCT/EP2005/050756 filed Feb. 22, 2005, which claims priority benefit from German Application 10 2004 034 103.6 filed Jul. 15, 2004, which are herein incorporated by reference.

The invention relates to a process for depositing layers containing silicon and germanium.

Processes such as molecular beam epitaxy (MBE), organic chemical vapor deposition (MOCVD) and atomic layer deposition (ALD) are described in the literature for the deposition of metal oxide layers, such as hafnium oxide, aluminum oxide and also praseodymium oxide.

MBE has the drawback that the layers are often of insufficient quality for device applications, in particular in the case of SiGe:C. When using UHV-CVD, a sufficiently low background contamination level can be achieved using low pressures. However, this is complex in terms of the vacuum technology employed and entails lower growth rates. In particular for Ge-rich heterostructures, drawbacks arise through low growth rates and high surface roughness. Other CVD methods use process pressures of the order of magnitude of 1-100 mbar and in relative terms achieve a reduction in impurity levels by using high purge flow rates of high-purity gases. Gases containing Si and Ge are often used as starting substances. These gases are problematic from a safety perspective and are also difficult to handle. This presents a correspondingly high risk of danger and imposes the need for complex safety measures. Many of these processes take place at high temperatures making it difficult to produce strained layers.

Some liquid starting substances (precursors) offer advantages for deposition at low temperatures and can therefore offer new perspectives with regard to production of in particular strained layers. The use of liquid starting substances (precursors) has hitherto been difficult. In general, conventional vaporization of liquid starting substances is carried out using heated vessels (bubblers). In this case, the starting substances are transferred to the gas phase by means of a carrier gas. The constant heating of the precursors often leads to deposition conditions which are not reproducible. Furthermore, complete saturation of the gas phase and therefore high growth rates can only be achieved with difficulty using arrangements of this type. Therefore, various liquid precursor feed systems which are based on sudden vaporization of small quantities of precursor by direct contact with heated surfaces have been developed for CVD. This involves drawbacks such as the vaporization performance varying over the course of time as a result of deposits on the heated surfaces and the formation of particles. These drawbacks could be avoided by periodic injection of liquid precursors into a heated volume with subsequent contact-free vaporization. When using conventional CVD, the poor atomic precision has led to inadequacies with regard to chemical composition and layer thickness control, for example when depositing very thin SiGe buffer layers which have a spatially graduated chemical composition.

Conventional MOCVD processes, which are based on liquid or solid precursors, use heated precursor vessels to convert liquid precursors into the gas phase by means of a carrier gas. Most precursors (or corresponding dilute solutions) tend to have a low volatility and to be chemically and thermally unstable and change or decompose under such conditions, making the deposition unreproducible. Consequently, various liquid precursor feed systems which are based on sudden vaporization of in each case small precursor quantities by direct contact with heated surfaces have been developed for MOCVD. This entails drawbacks such as vaporization performance varying over time as a result of deposits on the heated surfaces and the formation of particles. These drawbacks can be avoided by periodic injection of liquid precursors or solutions into a heated volume with subsequent contact-free vaporization. Conventional MOCVD presents problems, for example with the deposition of nanolaminates, on account of the poor atomic precision.

To ensure further development of electronic components for CMOS applications, it is necessary to supplement silicon technology. SiGe allows a higher speed to be achieved combined, at the same time, with a lower energy consumption. This is used even in existing technology and is very important for future technology generations. By using SiGe in, for example, HBTs, silicon technology will be able to successfully compete in the radio frequency range with III/V (e.g. GaAs) based structures. SiGe has the advantage of being compatible with standard silicon process technology and also that it can be produced at lower cost than corresponding III/V structures. HBTs are often integrated with BiCMOS structures. If SiGe is used, the energy band gap can be set as desired by varying the Si/Ge ratio. In HBTs, the band gap of the base is lower than that of the emitter. This both prevents the backflow of charge carriers and increases the emitter injection frequency as well as allowing very high doping of the base and therefore a higher frequency. The different lattice constants of Si and Ge allow the production of strained lattices, permitting a higher electron and hole mobility and therefore corresponding increases in power. To ensure this straining, the SiGe deposition must take place at relatively low temperatures. The properties can be further stabilized and/or improved with the aid of carbon doping, by preventing the outdiffusion of boron doping and therefore allowing more aggressive and high-performance layer structures to be developed. The production of strained layers in a high device quality often requires SiGe buffer layers with a spatially graduated chemical composition. With ongoing miniaturization in the next technology generations, these buffer layers will also have to become thinner and thinner, requiring deposition technology with a high level of precision and flexibility.

The invention relates to a process for depositing at least one semiconductor layer on at least one substrate in a process chamber, the semiconductor layer comprising a plurality of components, and the components being vaporized by means of discontinuous injection of a liquid starting material or a starting material dissolved in a liquid into a temperature-controlled vaporization chamber by means of, in each case, an associated injector unit, and this vapor being fed to the process chamber by means of a carrier gas.

A process and an apparatus of this type are known from DE 100 57 491. This apparatus is used to vaporize liquid starting substances or starting substances dissolved in a liquid. The injector unit produces an aerosol. The aerosol droplets are vaporized in the vaporization chamber, with the heat required being drawn from the gas located therein. Consequently, the vaporization is carried out without surface contact. Suitable starting materials are compounds as described in DE 100 56 932 A1 and DE 101 14 956 A1.

The invention is based on the object of providing a high-performance process which can be used to deposit silicon/germanium layers.

The object is achieved by the invention specified in the claims. Claim 1 and further independent Claim 16 are substantially directed at a first starting material containing silicon and a second starting material containing germanium. It is also provided that the mass flow parameters which determine the time profile of the mass flow through each injector unit, these parameters being, for example, the preliminary injection pressure, the injection frequency and the pulse/pause ratio, as well as the phase relationship of the pulses/pauses with respect to the pulses/pauses of the other injector unit(s), are individually set or varied.

The invention provides a process using discontinuous injection of one or more liquid starting substances which contain Si, Ge and/or C, into at least one heated volume, with subsequent conversion into the gas phase. This is used to produce SiGe, strained SiGe or SiGe:C layers. This process allows not only contact-free vaporization of the source materials and therefore reproducible and particle-free deposition of layers, but also accurate control of Si, Ge and C doping levels during layer formation by way of additional liquid precursor injector units, which can be set independently of one another in terms of injection rate and/or pulse/pause ratio but also phase relationship with respect to one another. This process consequently allows the formation of gradient layers by changing the individual quantities of starting substances added. In technical implementation, this is controlled by altering the respective injection frequency, pulse/pause ratio but also changes in preliminary injection pressure. When forming, for example strained Si on an Si surface, the advantages of the process developed will be clear, since the entire step of graduated SiGe buffer layer, unstrained SiGe layer and strained Si layer can be produced in one processing sequence by changing the gas phase composition and/or process conditions in situ. Therefore, advantages of this new process include a high throughput, good control of stoichiometry, high flexibility in terms of process conditions, atomically precise deposition, production of nanolaminates and hyper-structures, controlled deposition of nucleation layers and gradient layers. In particular, if this discontinuous injection is combined with a gas distributor, it is possible for the gaseous starting substances fed to the process chamber to be distributed homogeneously over large substrate areas. This allows a high degree of homogeneity during deposition combined, at the same time, with a highly flexible process window.

The process chamber is preferably a vacuum chamber. The pressure therein may be less than 1000 mbar. The process chamber can be heated. A plurality of layer sequences can be deposited on the substrate during a single process step. The deposition of the layer sequence is substantially effected by simply varying the mass flow parameters. The preliminary injection pressure and/or the injection frequency or the pulse/pause ratio can be varied in such a way that layers of different quality are deposited directly on top of one another without any need for a pause between the deposition of the successive layers. Furthermore, the process according to the invention makes it possible to deposit gradient structures. This is done by continuously varying the mass flow parameters during the deposition of at least one layer. As a result, a layer composition which changes continuously is formed in the vertical direction. This method can also be used to achieve continuous transitions between two deposited layers. It is advantageous if the mass flows of the starting materials to the injector units are determined by means of mass flow measurement. The mass flows can be set by varying the injection frequency, the pulse/pause ratio and/or the preliminary injection pressure. Suitable starting materials are in particular the tetramethyls of silicon and germanium or the tetraethyls of these elements. The precursors which are liquid at room temperature are particularly preferred: germanium tetrachloride, silicon tetrachloride, tetraethyoxygermanium, tetraethoxysilane. The precursors can be used in pure form. However, it is also possible to use organic solvents. In addition to liquids, other starter materials which can be used also include solids dissolved in a liquid. The layers may also contain nitrides. The substrate holder may be driven in rotation. An individual mass flow meter is associated with each injector unit. It is possible for a plurality of injector units to be associated with one multichannel injector unit. It is then advantageous if each multichannel injector unit has an associated individual vaporization chamber. Each of these vaporization chambers may be temperature controlled. The pipelines between the vaporization chambers and the process chamber may also be temperature-controlled. A gas distributor in showerhead form may be located inside the process chamber. This gas distributor in showerhead form is located above the substrate. The process gas flows out of the openings disposed on the underside of the gas distributor into the process chamber in order to react on the surface of the substrate, thereby forming the layer. The apparatus has an electronic control device. The individual mass flow parameters are set and controlled using this electronic control device.

The process is used to deposit SiGe layers. These are strained/unstrained SiGe layers. These layers may contain carbon. The process allows accurate setting of the layer composition and the formation of gradient layers by in situ mass flow adjustments to the individual sources with atomic-level control of chemical composition and layer thickness without interrupting the process sequence. In this way, by way of example, it is possible on a silicon substrate to deposit a transition layer on a germanium surface. To do this, the process is commenced by supplying only the component which contains silicon. The incoming flow of this component is then continuously reduced, and in association with this the incoming flow of the component which contains germanium is continuously increased, until ultimately only the germanium-containing component is being injected. This results in the formation of a lattice-matched transition from a silicon surface to a germanium surface.

An exemplary embodiment of the invention is explained below with reference to the accompanying drawings.

FIG. 1 shows in diagrammatic representation the structure of an apparatus for carrying out the process.

The apparatus is used to deposit single-component and multi-component materials using discontinuous injection of liquid or dissolved metal starting substances via a multichannel injector unit 6, it being possible for each channel 5 to be set individually in terms of its injection frequency, preliminary injector pressure, pulse/pause ratio and phase relationship with respect to one another with a view to mass flow control. This apparatus is to be used specifically for the deposition of silicon and germanium layers or SiGe layers on a silicon or germanium substrate.

In detail, the apparatus has a reactor, which forms a reactor chamber 14. This reactor chamber 14 is connected, using means which are not shown, to a vacuum device, likewise not shown. A heater 13 is located within the reactor chamber. The substrate 1 is arranged above the heater 13. The substrate 1 is illustrated on an enlarged scale in FIG. 1. In reality, it is mounted on a substrate holder, which may be driven in rotation. Above the substrate 1 is located the process chamber 2, which is delimited at the top by a gas distributor 15 of showerhead-like configuration.

A feed line 12 opens out into the gas distributor 15. The vaporized starting materials 3 together with a carrier gas 7 can be introduced into the gas distributor 15 through this feed line 12.

The abovementioned feed lines 12 may be temperature-controlled pipe connections. The latter connect the vaporization chambers 4 to the gas distributor 15.

In the exemplary embodiment illustrated, a total of three vaporization chambers 4 are provided. However, there may also be more or fewer than three. Each of these vaporization chambers 4 has a multichannel injector unit, denoted by reference numeral 6. Each multichannel injector unit 6 has a plurality of, in the exemplary embodiment four, injector units 5. However, there may also be more or fewer such injector units. Each injector unit 5 can be used to inject a liquid starting substance 3 or a starting substance 3 dissolved in a liquid into the vaporization chamber 4 in the form of an aerosol. Each injector unit 5 has an outlet valve which opens and closes in pulsed fashion. The pulse widths can be varied between a few seconds and a few milliseconds. The pulse widths can also be varied within the same range. Each injector unit 5 is actuated individually by a control device 17. The mass flow parameters pulse width, pause width and pulse frequency can be controlled individually. The mass flow through each injector unit 5 is measured by means of a mass flow meter 9. The preliminary injection pressure, which can likewise be set individually for each injector unit 5, is set by means of a pressure regulator 10. The pressure set by the pressure regulator 10 is applied to a reservoir in which the starting material is located.

A feed line for a carrier gas 7 opens out into each of the vaporization chambers 4. The mass flow of the carrier gas 7 is set by means of a mass flow controller 8.

Suitable starting materials are in particular the metalorganic silicon compounds and/or the metalorganic germanium compounds. These starting compounds are introduced into a vaporization chamber 4 in the form of pulses, together with an inert carrier gas, which may be a noble gas, hydrogen or nitrogen. The inert carrier gas may be preheated. However, it is preferable for the entire vaporization chamber to be preheated, so that the energy required for the vaporization can be taken directly from the gas located in the vaporization chamber 4. The vaporization therefore takes place without surface contact. The process according to the invention can be used to particularly advantageous effect if highly volatile, liquid or solid starting materials are provided. Solid starting materials can be dissolved in suitable solvents in order then to be injected into the vaporization chamber together with the solvents.

All features disclosed are (inherently) pertinent to the invention. The disclosure content of the associated/accompanying priority documents (copy of the prior application) is hereby incorporated in its entirety in the disclosure of the application, partly with a view to incorporating features of these documents in claims of the present application.

What is claimed:

1. A process for depositing at least one semiconductor layer on at least one substrate in a process chamber, the semiconductor layer comprising a plurality of components, and the components being vaporized by means of discontinuous injection of a liquid starting material or a starting material dissolved in a liquid into a temperature-controlled vaporization chamber by means of, in each case, an associated injector unit, and the vapor being fed to the process chamber by means of a carrier gas, characterized in that mass flow parameters which determine a time profile of a mass flow of a first starting material, which contains silicon, and a second starting material, which contains germanium, through the associated injector unit, said parameters including a preliminary injection pressure, an injection frequency and a-pulse/pause ratio, as well as a phase relationship of pulses/pauses with respect to pulses/pauses of other injector unit(s), are individually set or varied.

2. A process according to claim 1, wherein pressure in the process chamber is less than 1000 mbar.

3. A process according to claim 1, wherein pressure in the process chamber is less than 100 mbar.

4. A process according to claim 1, wherein the process chamber is temperature-controlled.

5. A process according to claim 1, wherein a plurality of layer sequences are deposited on the substrate during one process step.

6. A process according to claim 1, wherein only the mass flow parameters are varied during the deposition of a layer sequence.

7. A process according to claim 1, further comprising variation of the mass flow parameters during deposition of at least one layer, to form a layer composition which changes continuously in a vertical direction or to form continuous transitions between layers deposited in succession.

8. A process according to claim 1, wherein mass flows of the starting materials to the injector units are determined by means of mass flow measurement and the mass flows are set by varying the injection frequency, the pulse/pause ratio and/or the preliminary injection pressure.

9. A process according to claim 1, wherein said process providers deposition of one or more of: nanolaminates, hyperstructures, nucleation layers and gradient layers.

10. A process according to claim 1, wherein the starting material comprises solid starting materials dissolved in a liquid.

11. A process according to claim 1, wherein a gradient layer is deposited by injecting substantially only the first starting material, and thereafter continuously reducing the mass flow of the first starting material and continuously increasing the mass flow of the second starting material, until the first mass flow is substantially 0.

12. A process according to claim 1 characterized by an additional feed of nitrides.

13. A process-according to claim 1, wherein surfaces to be coated have vertical structures, in particular trenches into which the vaporized starting materials diffuse.

14. A process according to claim 1, wherein a deposited layer contains at least one of: carbon, boron, phosphorus, arsenic or another dopant.

15. A process according to claim 1, wherein at least one of the starting materials contains at least one of: germanium tetrachloride, silicon tetrachloride, tetraethyoxygermanium, tetraethoxysilane or a similar metalorganic compound of silicon or germanium.

16. A process according to claim 1, characterized in that the process takes place at a process temperature between 300° C. and 1200° C.

17. A process according to claim 1, characterized in that the process takes place at a process temperature between 500° C. and 1000° C.

18. A process for the discontinuous injection of liquid, chemically reactive starting materials which contain silicon and/or germanium, comprising using a multichannel injector unit to inject the starting materials such that, an injection frequency, a preliminary injection pressure, a pulse/pause ratio and a phase relationship with respect to other injector units is set in terms of a mass flow direction at each injector unit, and the injected starting substances, together with at least one inert carrier gas, are introduced into a temperature-controlled volume in which the starting materials are vaporized and subsequently deposited on a group IV substrate to form at least one silicon, germanium and/or SiGe layer.

19. A process according to claim 18, wherein at least one Si, SiGe and/or Ge layer is deposited epitaxially on a crystalline surface.

20. A process according to claim 18, wherein-at least one of the following layers is deposited: Si, Ge, SiGe, SiGe:C, Si/Ge hyperstructures, SiGe/SiGe hyperstructures, SiGe buffers, wherein "SiGe" encompasses various layers with $Si_{1-x}Ge_x$ ($0 \leqq x \leqq 1$).

21. A process according to claim 18 characterized in that the starting materials are injected simultaneously.

22. A process according to claim 18 characterized in that the starting materials are injected alternately.

23. A process according to claim 18 characterized in that the starting materials, when converted into gas form, are distributed homogeneously over area taken up by the substrates using a gas distributor.

24. A process according to claim 18 characterized in that the substrate rotated during deposition.

25. A process according to claim 18 characterized in that of the deposited layers at least one is strained.

26. A process according to claim 18 characterized in that of the deposited layers at least one is unstrained.

27. A process according to claim 18 characterized in that a chemical composition of the layer is altered as a spatial function.

28. A process according to claim 18, wherein injection occurs via-at least two injector units, which can be controlled independently, for supplying the starting substances in parallel for deposition of layers of different types.

29. A process according to claim 18 in that the mass flows of the components containing germanium and silicon into the process chamber, taken as an average over a plurality of pulses, are altered continuously or in steps, in such a manner that the mass ratio of silicon and germanium in the layer deposited on the substrate varies over the height of the layer.

* * * * *